(12) United States Patent
Donohoe et al.

(10) Patent No.: US 6,312,556 B1
(45) Date of Patent: *Nov. 6, 2001

(54) BEAT FREQUENCY MODULATION FOR PLASMA GENERATION

(75) Inventors: Kevin G. Donohoe, Boise; Marvin F. Hagedorn, Meridian, both of ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/594,930

(22) Filed: Jun. 15, 2000

Related U.S. Application Data

(63) Continuation of application No. 09/120,779, filed on Jul. 22, 1998, now Pat. No. 6,126,778.

(51) Int. Cl.$^7$ .............................. H05H 1/00; C23C 16/00
(52) U.S. Cl. .............. 156/345; 118/723 E; 118/723 AN; 118/723 I
(58) Field of Search ................... 156/345; 118/723 E, 118/723 AN, 723 I, 723 IR; 204/298.06, 298.08, 298.34, 192.12; 315/111.51; 438/680, 689, 710; 427/355, 567

(56) References Cited

U.S. PATENT DOCUMENTS

| | | |
|---|---|---|
| 4,963,239 | 10/1990 | Shimamura et al. . |
| 5,310,452 | 5/1994 | Doki et al. . |
| 5,573,595 | 11/1996 | Dible . |
| 5,882,424 | * 3/1999 | Taylor et al. ................... 134/1.1 |
| 5,985,375 | 11/1999 | Donohoe et al. . |

OTHER PUBLICATIONS

Yamada, et al., J. Vac. Sci. Technol. A 14(5), Sep./Otc. 1996, pp. 2859–2870, "Model for a large area multi–frequency multiplanar coil inductively coupled plasma source".*

Yamada, et al., Electrochemical Society Proceedings, 1996, vol. 12, pp. 126–136, "A large are multi–frequency multi–planar coil inductively coupled plasma source".*

Doh, H.H. et al., "Effects of Bias Frequency on RIE Rag in Electron Cyclotron Resonance Plasma Etching System," 43rd National Symposium, Abstracts, Pennsylvania Convention Center, Philadelphia, Pennsylvania Oct. 14–18, 1996 (2 pages).

Roberts, Randy, "The ABCs of Spread Spectrum," Spread Spectrum Scene, The Wireless, PCS and Advanced Digital Communications Internet Magazine, Sep. 4, 1996 (7 pages).

Serway, Raymond A., *Physics for Scientists & Engineers With Modern Physics*, 2nd Ed., Saunders College Pub., Philadelphia, 1986.

* cited by examiner

*Primary Examiner*—Gregory Mills
*Assistant Examiner*—P. Hassanzadeh
(74) *Attorney, Agent, or Firm*—TraskBritt

(57) ABSTRACT

An apparatus and method for providing a modulated-bias plasma are described. In particular, an RF source or collector includes one or more sources to provide differing driving frequencies or bias frequencies, respectively. These frequencies, over time, interfere with one another to produce beating at one or more controllable, infinitely variable beat frequencies. As a beat frequency has significantly fewer cycles per second than a driving or bias frequency, a modulated-bias plasma may be provided without turning power on and off as in conventional "pulsed" plasma systems. Beat frequencies facilitate modulation of the driving or bias frequencies, which may lie within a relatively narrow frequency band. Also, the use of a plurality of driving or bias frequencies facilitates use of more conventional RF sources or collectors owing to lower power requirements at each frequency. In accordance therewith, the apparatus and method described may be employed for plasma etching and/or plasma enhanced vapor deposition.

15 Claims, 10 Drawing Sheets

BEAT FREQUENCY MODULATION FOR PLASMA GENERATION

CROSS-REFERENCE TO RELATED APPLICATION

This application is a continuation of application Ser. No. 09/120,779, filed Jul. 22, 1998, now U.S. Pat. No. 6,126,778.

BACKGROUND OF THE INVENTION

1. Field of the Invention

The present invention relates generally to modulated plasma generation and, more particularly, relates to a method and apparatus for modulated-bias plasma generation for etching of and for depositing one or more layers onto a substrate assembly.

2. State of the Art

A plasma is a collection of electrically charged and neutral particles. In a plasma, the density of negatively-charged particles (electrons and negative ions) is equal to the density of positively-charged particles (positive ions). A plasma also contains radicals. A radical is an atom or molecule with unsatisfied chemical bonding having an equal number of electrons and protons. All of the above-mentioned particles have a rate of decay. Consequently, by withdrawing a power source employed for plasma generation, the concentrations of these particles tend to decay.

Radicals are generally more abundant than ions in plasmas for two principal reasons. First, radicals are generated at a higher rate than ions, owing to a lower threshold energy and to ionization often being disassociative. Disassociation occurs if a collision between an electron and a polyatomic molecule results in a breakup of the molecule. Electron energy must be greater than molecular bonding energy for disassociation. Secondly, many radicals have a longer lifetime than many ions. For example for a high-density plasma (a high-density plasma is typically defined as having an ion-electron density on the order of $10^{11}$–$10^{13}$ ions-electrons per $cm^3$) operating at 1 mtorr, neutral to ion ratio is on the order of 100:1 to 1:1. Notably, some consider high density plasmas to have an ion-electron density greater than or equal to $10^{10}$ ions-electrons per $cm^3$.

Plasma generation may be conducted by applying power to electrodes in a chamber of a reactor. In diode or parallel plate reactors, power is applied to one electrode to generate a plasma. In triode reactors, power is typically applied to two of three electrodes to generate a plasma.

In radio frequency (RF) plasma generation for a diode reactor a sinusoidal signal is sent to an electrode of a pair of electrodes. Conventionally, a wafer chuck or susceptor is the powered electrode. Examples of parallel plate reactors include the 5000MERIE from Applied Materials, Santa Clara, Calif.

A plasma source material, which typically includes one or more gases, is directed to an interelectrode gap between the pair of electrodes. Amplitude of the RF signal must be sufficiently high for a breakdown of plasma source material. In this manner, electrons have sufficient energy to ionize the plasma source material and to replenish the supply of electrons to sustain a plasma. The ionization potential, the minimum energy needed to remove an electron from an atom or molecule, varies with different atoms or molecules.

In a typical triode reactor, three parallel plates or electrodes are used. The middle or intermediate electrode is conventionally located in between a top and bottom electrode, and thus two interelectrode cavities or regions are defined (one between top and middle electrode and one between middle and bottom electrode). The middle electrode typically has holes in it. Conventionally, both the top and bottom electrode are powered via RF sources, and the middle electrode is grounded. Examples of triode reactors are available from Lam Research, Fremont, Calif., and Tegal Corporation Ltd., San Diego, Calif.

Parallel plate and triode reactors generate capacitively coupled plasmas. These are conventionally "low density" plasmas (ion-electron density of less or equal to $10^{10}$ ions-electrons per $cm^3$) as compared with high-density (also known as "hi density") plasmas which are generated by systems such as electron cyclotron resonance (ECR) and inductively coupled plasma (ICP). For ICP systems, an inductive coil (electrode) is conventionally driven at a high frequency using an RF supply. The inductive coil and RF supply provide a source power or top power for plasma generation. In ECR systems, a microwave power source (for example, a magnetron) is used to provide a top power. Both ICP and ECR systems have a separate power supply known as bias power or bottom power, which may be employed for directing and accelerating ions from the plasma to a substrate assembly or other target. In either case, voltage applied to a susceptor or wafer chuck (also known as the direct current (DC) bias), is affected by the bottom power (RF bias); whereas, current is affected by the top power.

In ICP systems, for example, ion density and ion energy distribution at surfaces in contact with a plasma depend on amplitude and frequency of a supplied RF bias. RF bias frequency can affect ion energy distribution (IED) at low frequencies. Such distribution may be bimodal, such as at lower frequencies characterized by a low energy tail of ions, and at higher frequencies characterized by a decrease in the low energy tail and by an ion energy distribution describable with a single energy level. Consequently, RF bias frequency can have a noticeable effect on a wafer surface or reactor walls.

In an abstract entitled "Effects of Bias Frequency on RIE Lag in Electron Cyclotron Resonance Plasma Etching System," H. H. Doh, K. W. Whang, Seoul National University, Korea, and C. K. Yeon, of LG Semicon Co. Ltd. Presented for the $43^{rd}$ National Symposium (AVS), Philadelphia, Penn., Oct. 14–18, 1996, etch rate of $SiO_2$ contact holes with sizes from 0.3 to 1.2 μm using a $C_4F_8+H_2$ ECR plasma etching system was examined. The parameters were: pressure (3 to 7.5 mTorr), microwave power (300 to 800 W), bias voltage (100 to 300 V), and bias frequency (100 kHz to 1 MHZ). As bias voltage and microwave power were increased, an improvement in RIE (Reactive Ion Etch) lag was reported. When the bias frequency was increased from 100 kHz to 800 kHz, maintaining the same bias voltage, an RIE lag improvement was reported even with a 30% $H_2$ addition. IEDs were calculated using a Monte-Carlo particle-in-cell method, indicating bimodality below the frequency of 30 MHZ. As bias frequency increases from 100 kHz to 1 MHZ, the peak of low energy part decreases and the peak of high energy part increases. It was suggested that this change in IED is responsible for RIE lag improvement. Therefore, maintaining a high bias frequency may improve RIE lag.

While relatively high frequencies are employed for etching, these signals are pulsed at a lower frequency for providing a pulsed plasma. Conventionally, a pulsed plasma is pulsed by turning the driving power on and off. Typically, the driving power is turned on and off sufficiently rapidly to preclude extinction of the plasma during the off time. This turning on and off of power is inefficient with respect to power consumption and transients. It would be desirable to provide a pulsed plasma without the above-mentioned drawback.

BRIEF SUMMARY OF THE INVENTION

The present invention provides a method and apparatus for pulsed plasma generation and, in particular, for modulated-bias plasma generation. Such pulsed plasma may be used for vapor deposition and/or etch. By pulsed plasma generation in accordance with the present invention, it is meant that a pulsed plasma is provided without having to turn power on and off. By modulated-bias plasma, in accordance with the present invention, it is meant that plasma is generated, at least in part, by bias power or driving power modulated by at least one beat frequency.

In particular, the present invention facilitates maintaining an amplitude modulated plasma by combining differing RF frequencies or allowing such RF frequencies to interfere with one another. Such combination or interference results, over time, in a beat frequency component and which facilitates amplitude modulation of a bias or driving signal for modulated plasma generation or maintenance. The present invention may be employed in inductively coupled, capacitively coupled, electron cyclotron resonance, and microwave systems. In systems susceptible to use with the present invention, at least one RF source or collector (the terms "RF source" and "RF collector" are used interchangeably) provides differing frequencies. These frequencies interfere with one another to produce beating, or one or more beat frequencies. As the beat frequency has significantly fewer cycles per second than a driving or bias frequency, a modulated-bias plasma may be provided. Beat frequencies facilitate modulation of a driving or bias signal.

The present invention provides at least one beat frequency which has a lower frequency than a driving or bias frequency. As high density plasma systems are not particularly efficient at low driving frequencies, modulating a driving frequency with a beat frequency provides a modulated bias signal, without frequency reduction of the bias signal, to effect pulsing. In diode and triode systems, ion energy incident for etching is increased by beating owing to heating with different RF frequencies. Also, as power is not necessarily being turned on and off to effect pulsing in such systems, improvements in power consumption and efficiency over the prior art may be achieved.

A beat frequency facilitates modulation of a driving or bias signal, which may lie within a relatively narrow frequency band. Also, the use of a plurality of driving or bias frequencies facilitates use of more conventional RF sources or collectors owing to lower power requirements at each frequency.

Other features and embodiments of the present invention are described or are apparent from reading the detailed description or by practicing the present invention.

BRIEF DESCRIPTION OF THE SEVERAL VIEWS OF THE DRAWINGS

The features of the present invention, as well as objects and advantages, will best be understood by reference to the appended claims, detailed description of particular embodiments and accompanying drawings where:

Figure 1:
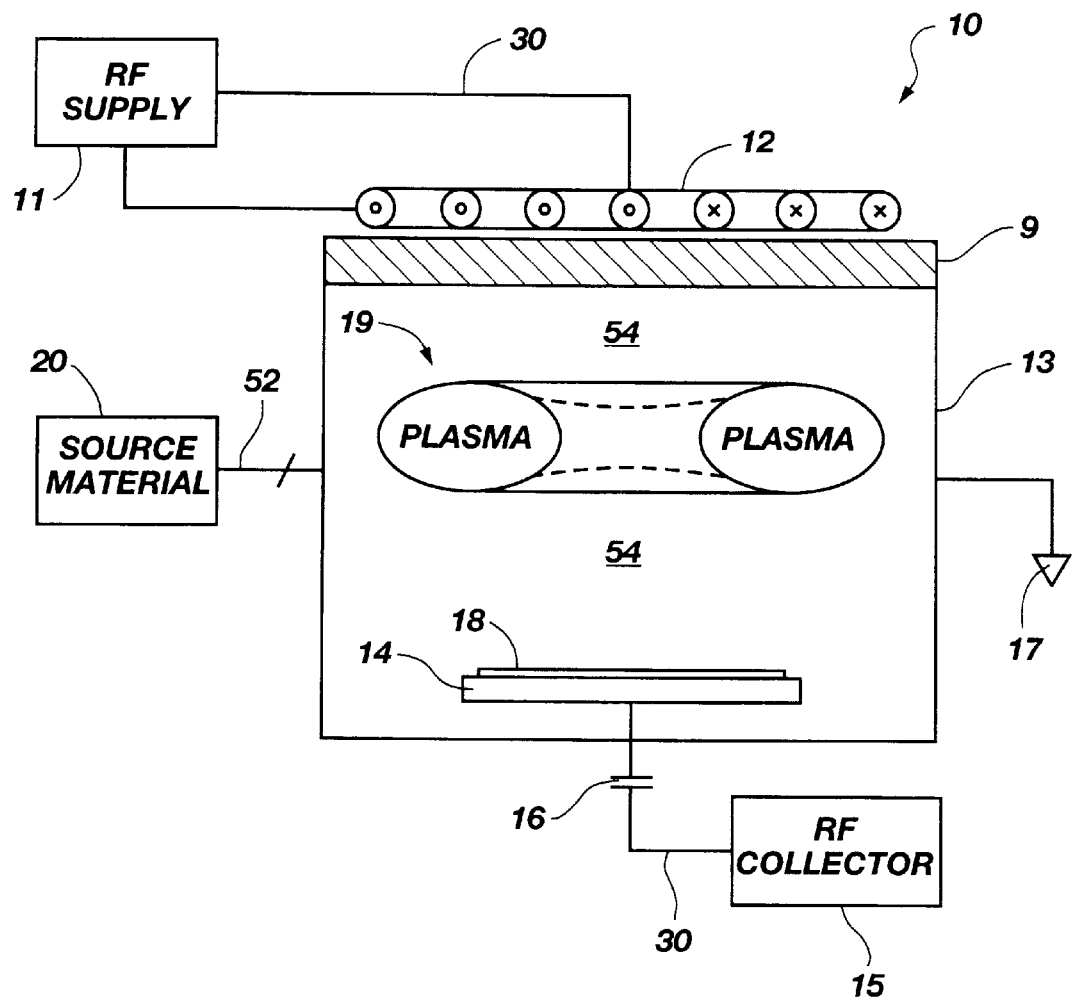
FIG. 1 is a block diagram of an inductively coupled plasma ("ICP") system in accordance with present invention.

Reference numbers refer to the same or equivalent parts of the present invention throughout the several figures of the drawing.

DETAILED DESCRIPTION OF THE INVENTION

Referring to FIG. 1, there is shown a block diagram of inductively coupled plasma ("ICP") system 10 in accordance with present invention. System 10 is a planar configuration ICP reactor. System 10 includes radio frequency ("RF") supply 11, coil 12, chamber 13, dielectric plate 9, multi-frequency RF collector (source) 15, and decoupling capacitor 16. Chamber 13 is connected to ground potential 17. Electrode 14 is for applying a bias voltage or bottom power. Electrode 14 may be an electrostatic-chuck or susceptor for holding wafer 18. Wafer 18 may be a bare wafer or a substrate assembly. A substrate assembly is a wafer having one or more sections implanted, diffused, deposited, and the like.

Modulated-bias plasma 19 is generated in chamber 13 from source material (matter) 20 (for example, one or more gases). Source material 20 may be provided to chamber 13 via one or more feed tubes 52. Wafer 18 is reacted with plasma 19. Such reaction may include etching a portion of a surface of wafer 18. This process is known as plasma etching or dry etching.

Figure 2:
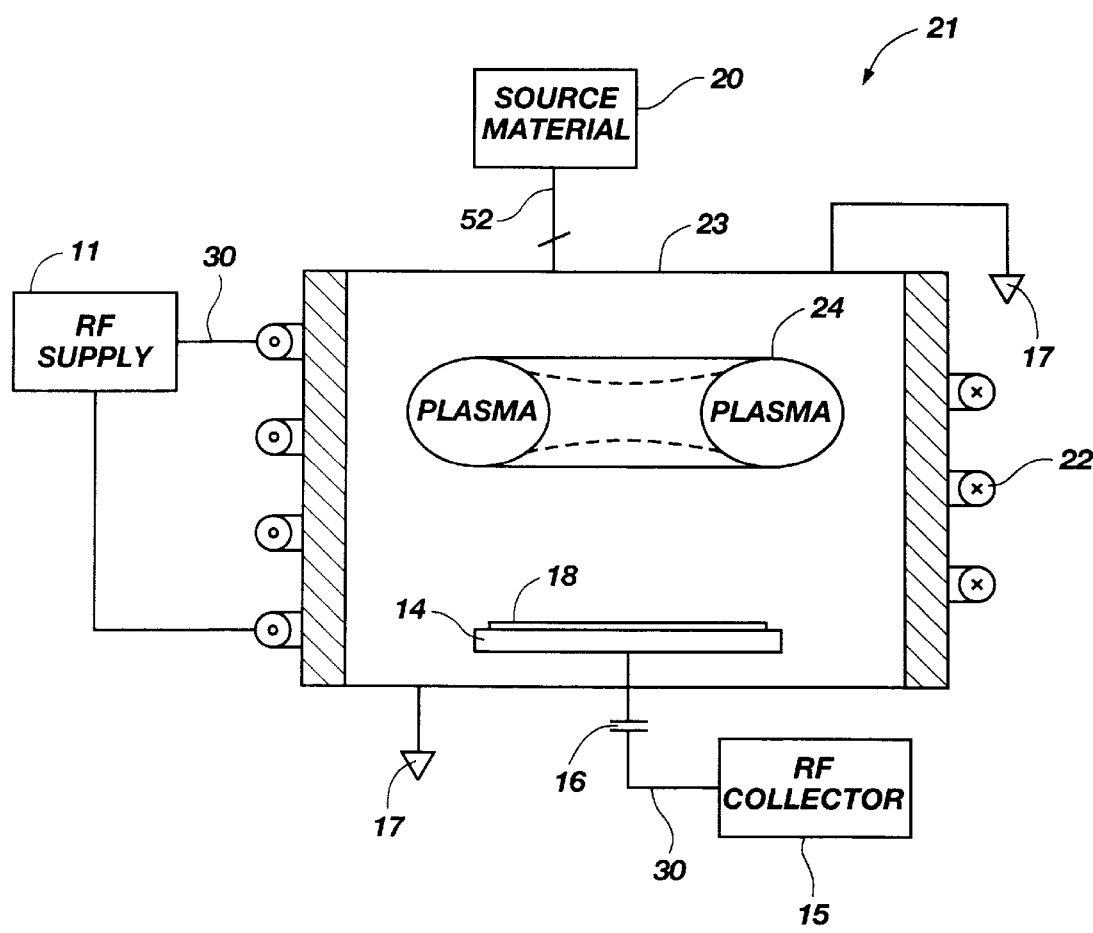
FIG. 2 is a block diagram of an ICP system in accordance with the present invention.

Referring to FIG. 2, there is shown a block diagram of an ICP system 21 in accordance with the present invention. ICP system 21 is similar to system 10 of FIG. 1, except that system 21 is a cylindrical configuration. Coil 22 is cylindrically wound around chamber 23, whereas coil 12 of system 10 of FIG. 1 is helically wound coil in a substantially planar manner and suspended above chamber 13.

Aside from multi-frequency RF collector 15, and resulting modulated-bias plasmas 19 and 24, all of which are provided in accordance with the present invention, systems 10 and 21 are well known in the art of the present invention. Such systems include a Lam TCP 9100 from Lam Research, Fremont, Calif., and Applied Materials HDP Etcher from Applied Materials, Santa Clara, Calif. In order to more clearly describe the present invention, some conventional details with respect to systems 10 and 21 have been omitted.

Figure 3:
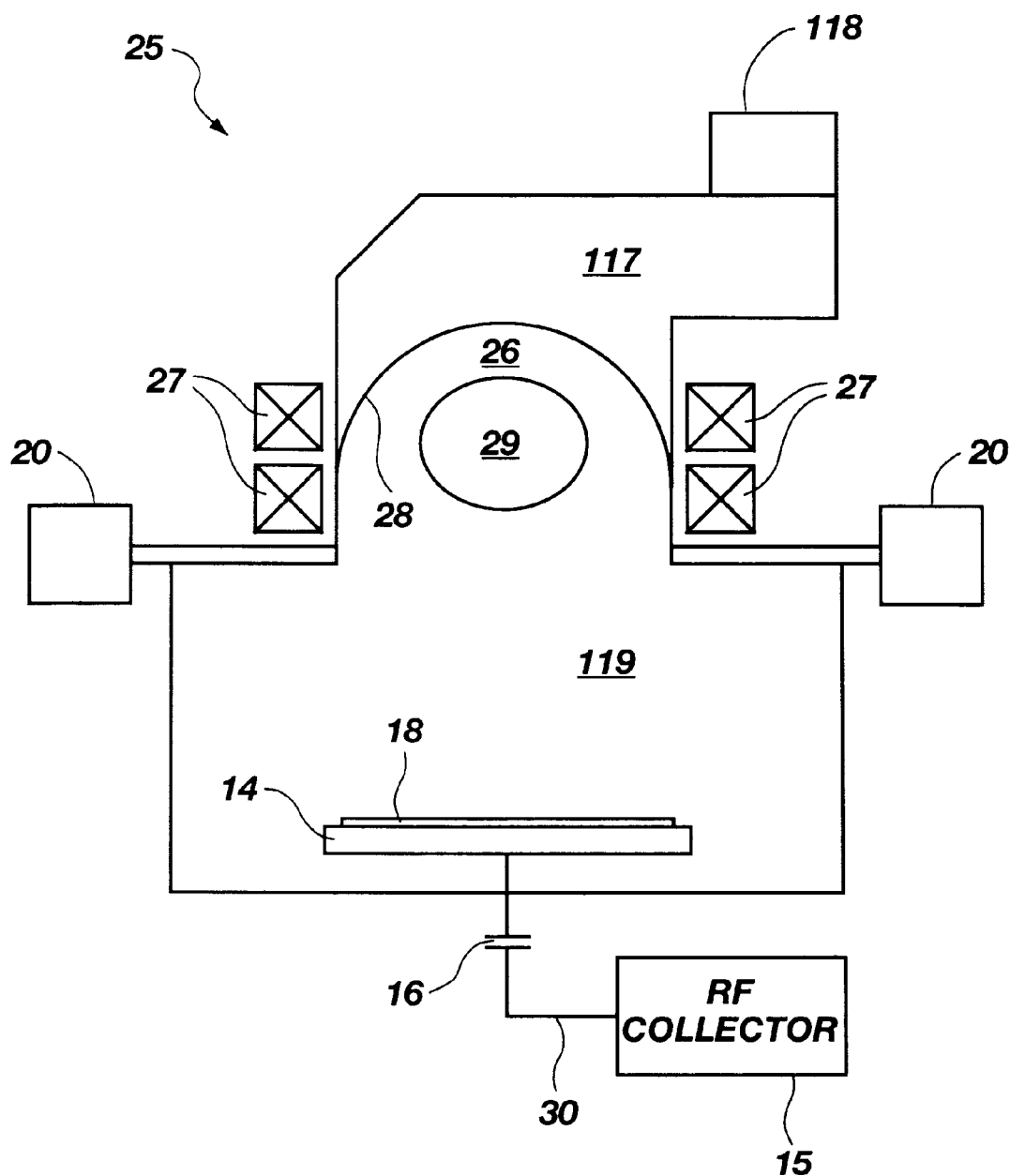
FIG. 3 is a block diagram of an ECR system in accordance with the present invention.

Referring to FIG. 3, there is shown a block diagram of an ECR system 25 in accordance with the present invention. Bell jar 28 forms a semi-hemispherical-like contour to define upper chamber portion 26. Upper chamber portion 26 has coil 27 wound around it and bell jar 28. If coil 27 is omitted, system 25 forms a microwave system, which also may be employed in accordance with the present invention.

Modulated-bias plasma 29 is generated in upper chamber portion 26. Magnetron 118 provides microwaves which are guided to bell jar 28 via waveguide 117. Plasma effluent from modulated-bias plasma 29 travels to lower chamber portion 119 to wafer 18. Aside from multi-frequency RF collector 15 and resulting modulated-bias plasma 29, which are provided in accordance with the present invention, such ECR systems are well known in the art of the present invention. Consequently, some conventional details with respect to system 25 have been omitted in order to more clearly describe the present invention. One exemplary ECR system is the M308AT ECR metal etcher from Hitachi, Japan.

Figure 4:
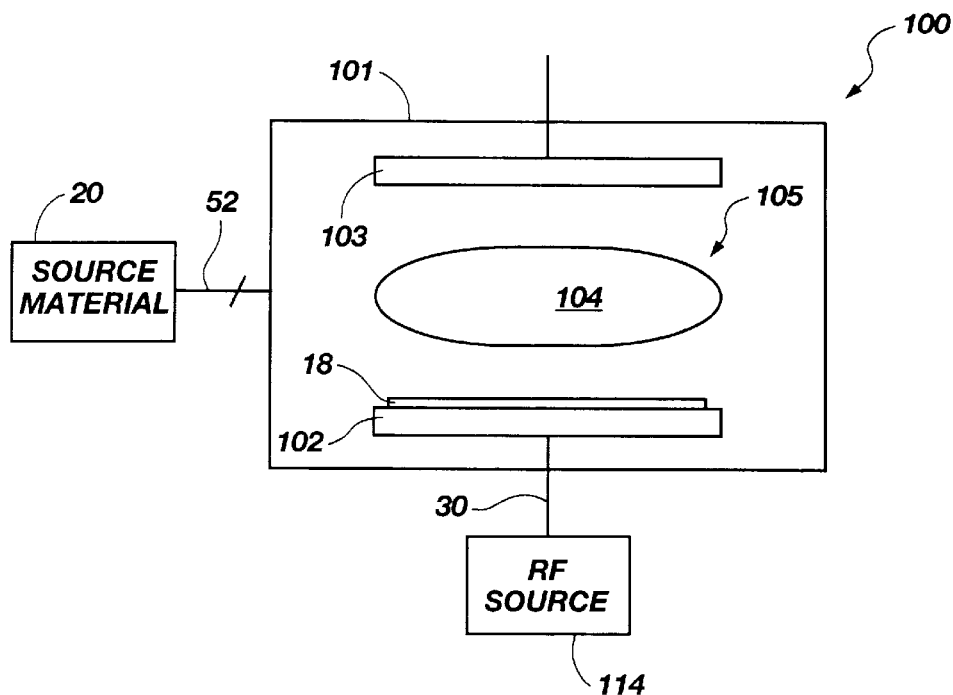
FIG. 4 is a block diagram of a parallel plate system in accordance with the present invention.

Referring now to FIG. 4, there is shown a block diagram of a parallel plate system 100 in accordance with the present invention. Chamber 101 has a pair of RF electrodes 102, 103. Electrode 102 includes a chuck for holding wafer 18. Modulated-bias plasma 104 is formed in region 105 between plates or RF electrodes 102, 103. Modulated-bias plasma 104 formation or generation is facilitated by multi-frequency RF source 114. While no independent bias source is provided in system 100, the term "modulate-bias" plasma is used herein to describe pulsed plasma generation by modulating a source, whether a bias or driving source. Aside from multi-frequency RF source 114 and resulting modulated-bias plasma 104, which are provided in accordance with the present invention, such parallel plate systems are well known in the art of the present invention. Consequently, some conventional details with respect to system 100 have been omitted in order to more clearly describe the present invention.

Figure 5:
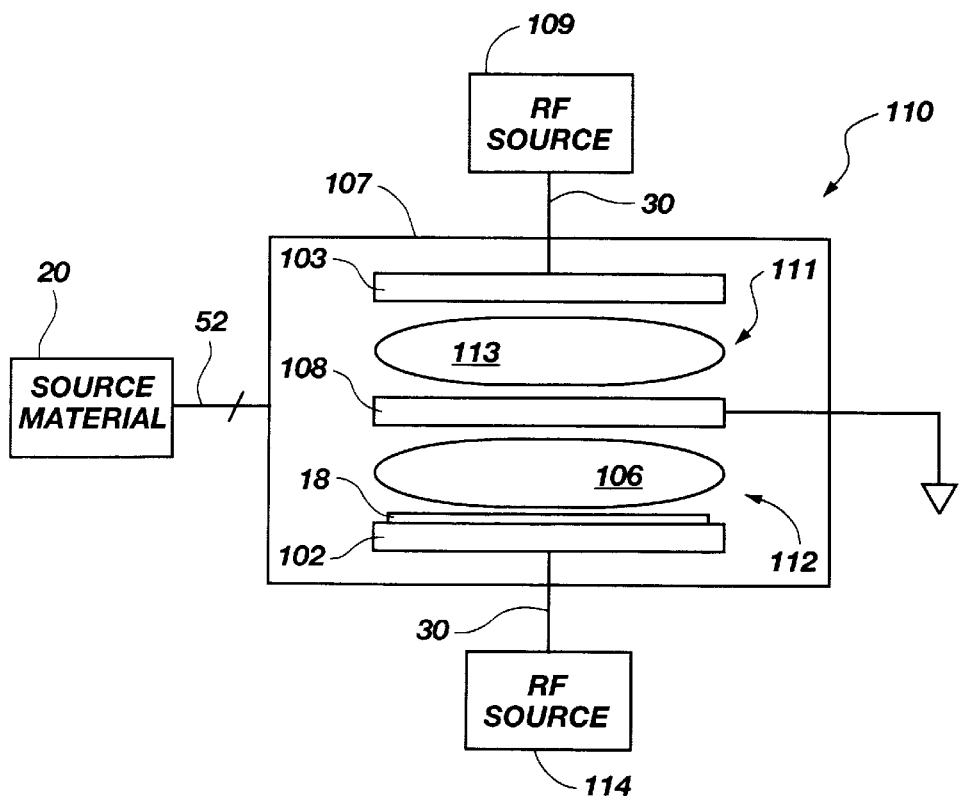
FIG. 5 is a block diagram of a triode system in accordance with the present invention.

Referring now to FIG. 5, there is shown a block diagram of triode system 110 in accordance with the present invention. Like chamber 101 of FIG. 4, chamber 107 has a pair of RF electrodes 102, 103. RF electrode 102 includes a chuck for holding wafer 18. Conventionally, chamber 107 also generally includes electrode 108 coupled to a ground. Moreover, a triode system from Tegal uses an electrically grounded cylindrical chamber body for a third electrode instead of electrode 108. Modulated-bias plasmas 106, 113 are formed in regions 111, 112 defined by plates or RF electrodes 102, 103, 108. Modulated-bias plasma 106, 113 formation or generation is facilitated, at least in part, by at least one multi-frequency RF source 114 and 109. Aside from multi-frequency RF sources 114, 109 and at least one resulting modulated plasma 106, 113, which are provided in accordance with the present invention, such triode systems are well known in the art of the present invention. Consequently, some conventional details with respect to system 110 have been omitted in order to more clearly describe the present invention.

It should be readily apparent to one of ordinary skill in the art that the systems described hereinabove may be used for pulsed-plasma enhanced chemical vapor deposition (PPECVD) and/or pulsed-plasma enhanced vapor deposition. For example, in a PPECVD system, source material 20 (shown in FIGS. 1 through 5) may comprise a supply of one or more carrier gases, a supply of one or more precursor gases, and a supply of one or more source gases. Such gases may be premixed for delivery to a chamber or mixed insitu within a chamber. Thus, one or more feed tubes 52 (shown in FIGS. 1 through 5) may be employed. Many conventional details with respect to a vapor deposition system may be found in U.S. Pat. No. 5,344,792 to Sandhu et al. which is incorporated by reference as though fully set forth herein.

Figure 6:
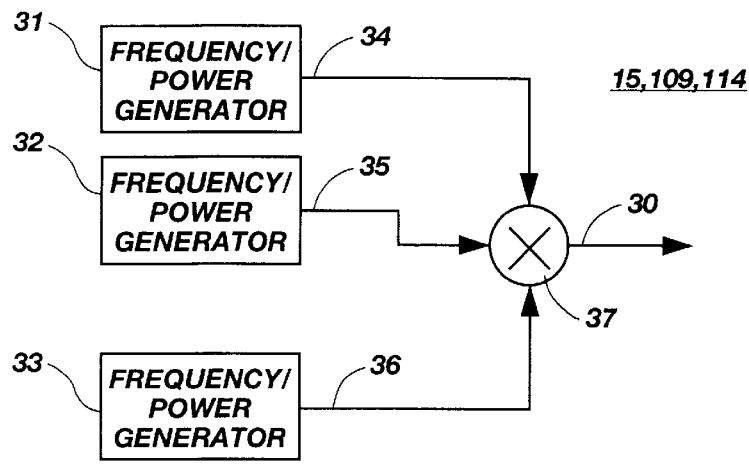
FIG. 6 is a block diagram of an exemplary portion of an embodiment of RF sources and collectors in accordance with the present invention.

Referring now to FIG. 6, there is shown a block diagram of an exemplary portion of an embodiment of RF collector or sources 15, 109, 114 in accordance with the present invention. RF collector or sources 15, 109, 114 include two or more frequency generators 31, 32, 33. Output signals 34, 35, 36 of frequency generators 31, 32, 33, respectively, are provided to converter or mixer 37. Mixer 37 combines output signals 34, 35, 36 to provide output signal 30, having a beat frequency component.

Figure 7:
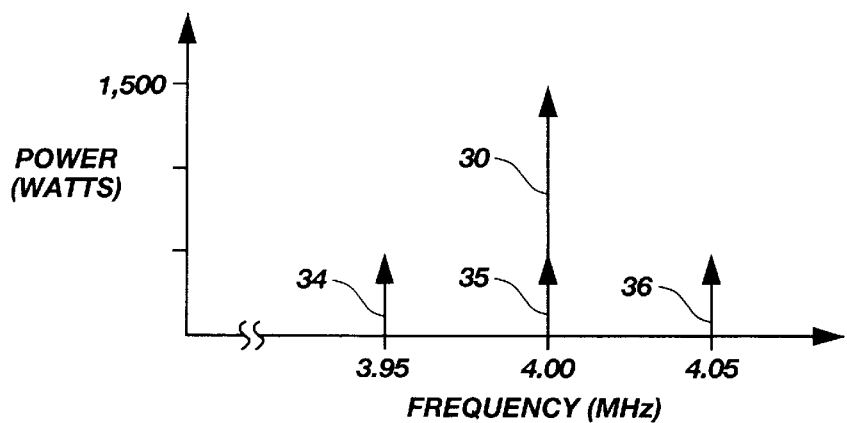
FIG. 7 is a graphical representation of frequency and power distribution for discrete values of an RF signal in accordance with an embodiment of the present invention.

Frequency generators 31, 32, 33 may each provide a discrete frequency and a discrete power level, as illustratively shown in FIG. 7. Generators for providing such discrete frequencies and power levels are well known. Alternatively, frequency generators 31, 32, 33 may provide a spectrum of frequencies and/or power levels, as illustratively shown in FIG. 8. In such a case, only one frequency generator 31, 32, 33 may be employed in accordance with the present invention. Generators for providing such a spectrum of frequencies and powers are also well known.

If output signal 34 is of the form $A \sin \omega_1 t$ and output signal 35 is of the form $B \sin \omega_2 t$, in the instance where mixer 37 comprises a multiplier, then output signal 30 is of the form $(AB/2)(\cos(\omega_1 t - \omega_2 t) - \cos(\omega_1 t + \omega_2 t))$, and beat signals $\cos(\omega_1 t - \omega_2 t)$ and $\cos(\omega_1 t + \omega_2 t)$ are produced. However, frequencies and powers used for plasma generation tend to be too high for most multipliers; consequently, a summing junction is preferred. Where mixer 37 comprises a summer, a result similar to that shown for a multiplier may be achieved by adding or subtracting separate signals of different frequencies.

While the present invention has been explained in terms of mixing bias power signals prior to providing same to plasma source matter, it should be understood that such mixing of signals may occur in-situ or contemporaneously with plasma generation. In which case mixer 37 may be omitted. Moreover, it should be understood that filters may be employed for blocking out unwanted frequencies.

By way of example and not limitation, in FIG. 7 there is shown a graphical representation of frequency and power distribution for discrete values of an RF signal in accordance with an embodiment of the present invention. Output signal 34 may be set at a frequency of 3.95 MHZ and a power of 500 watts; output signal 35 may be set at a frequency of 4.00 MHZ and a power of 500 watts; and output signal 36 may be set at a frequency of 4.05 MHZ and a power of 500 watts. The resulting combined output, namely output signal 30, will be the combination of the individual powers (e.g., 1500 watts). Over time, frequencies will overlap one another, and interference between such overlapping frequencies will provide beat frequencies, the peaks of which will comprise signals at maximum power.

Figure 8:
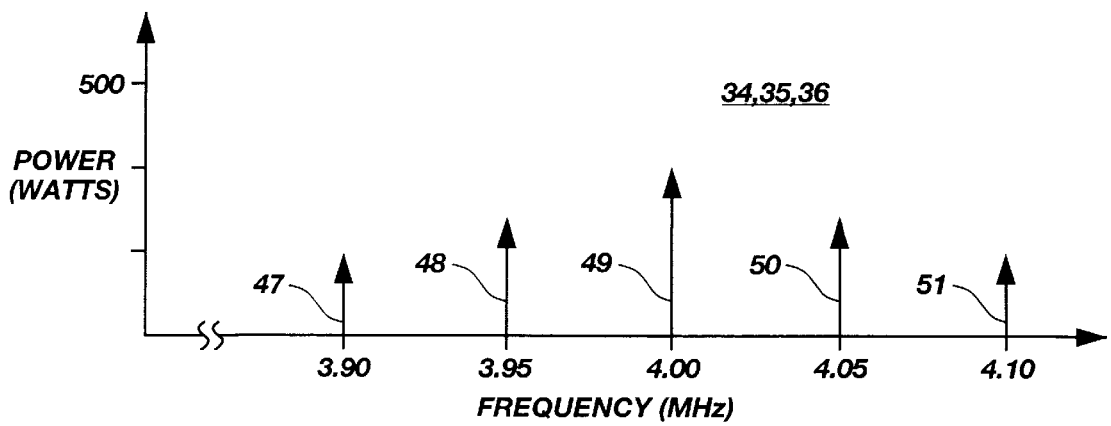
FIG. 8 is a graphical representation of frequency and power distribution for a spectrum of values of an RF signal in accordance with another embodiment of the present invention.

By way of example and not limitation, in FIG. 8 there is shown a graphical representation of frequency and power distribution for a spectrum of values of an RF signal in accordance with another embodiment of the present invention. Output signals 34, 35, 36 may each have a component of 4.00 MHZ as a primary frequency 49, as well as harmonics 47, 48, 50, 51 which vary by 0.05 MHZ increments in both decreasing and increasing directions. The result is a frequency distribution rather than a set frequency.

Figure 9:
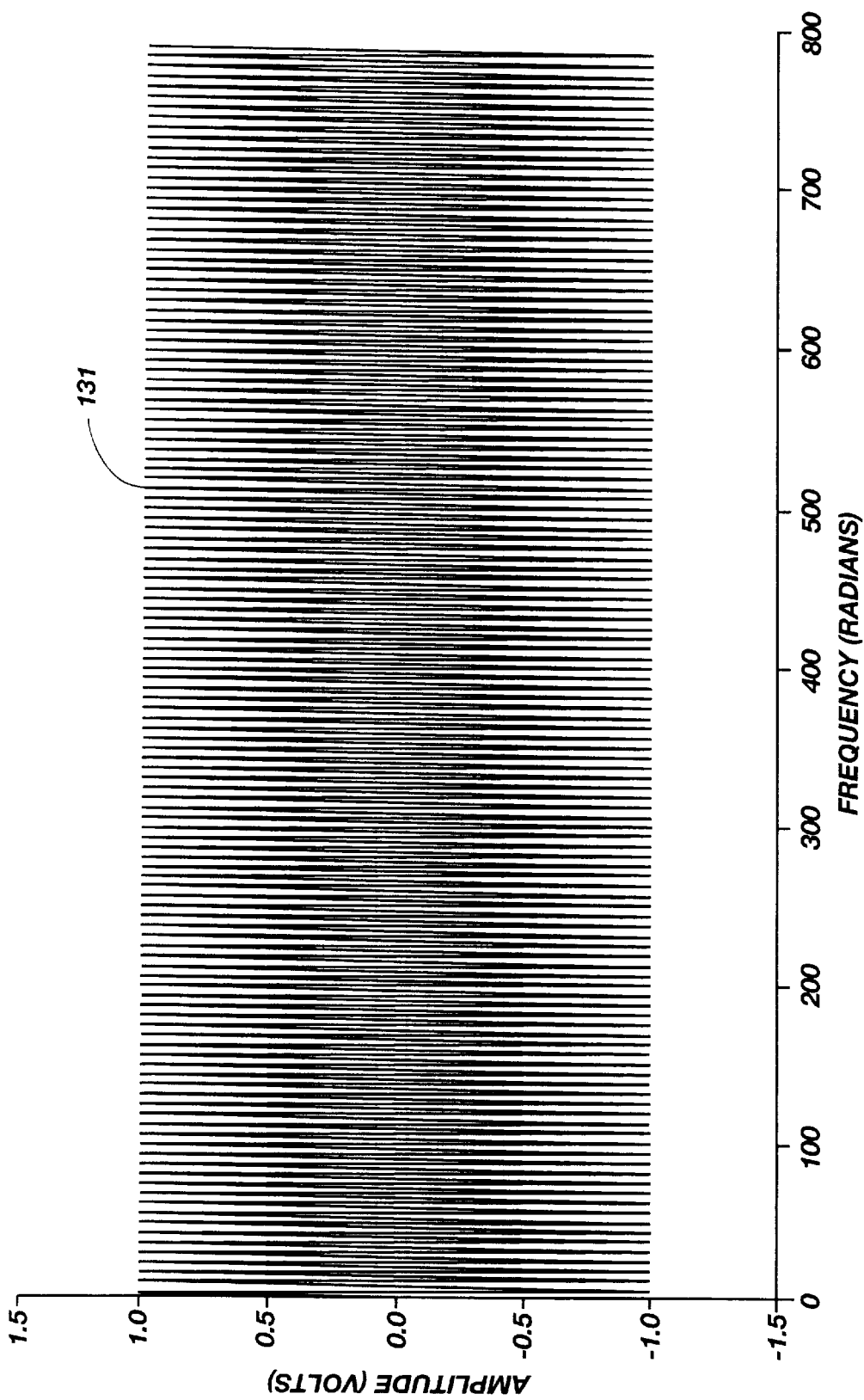
FIG. 9 is a graphical representation of a fundamental (one) frequency operation of the prior art.

Referring to FIG. 9, there is shown a graphical representation of a fundamental (one) frequency operation of the prior art. Signal 131, namely, sin ωt, for ω=2πf, has a fundamental frequency, f.

Figure 10:
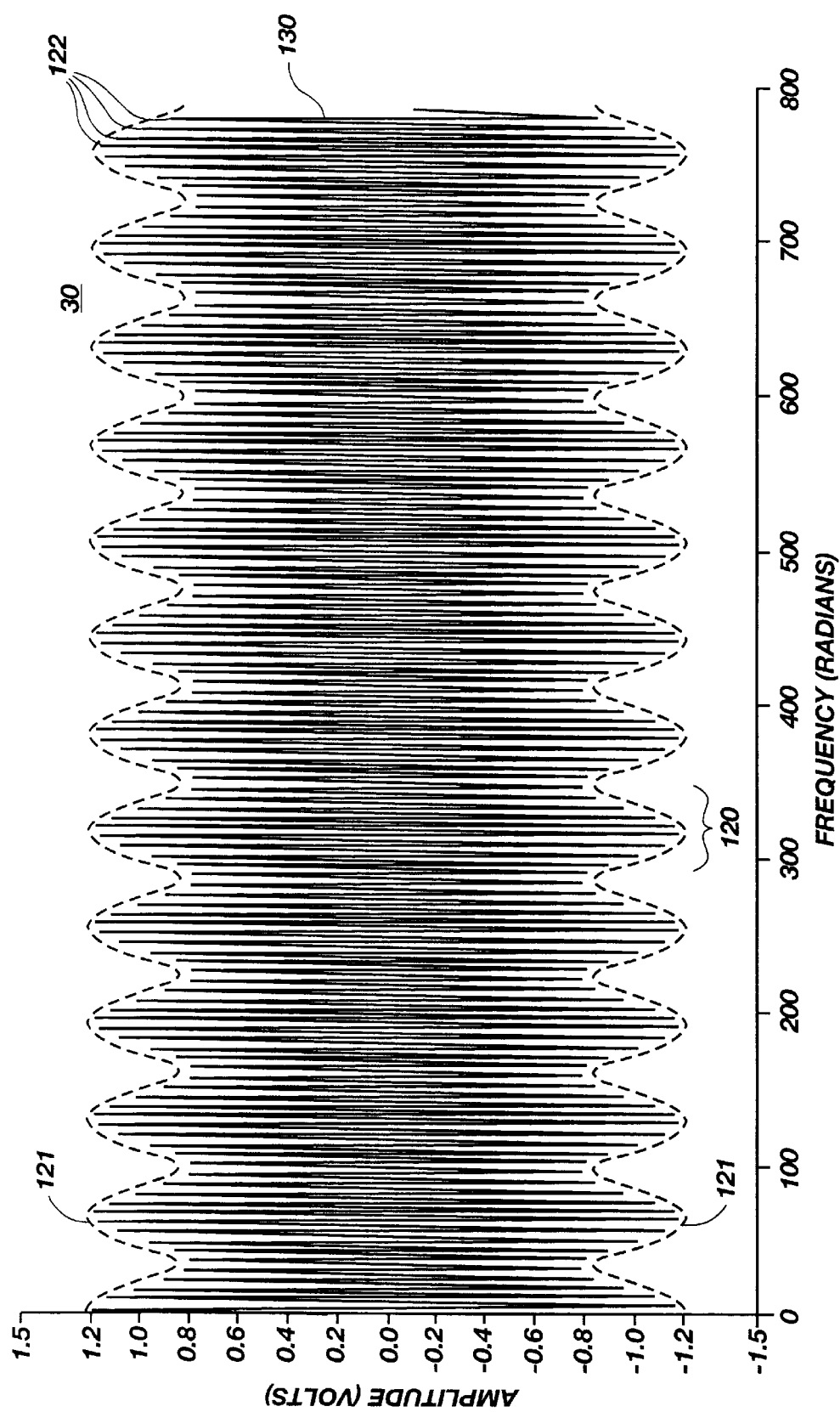
FIGS. 10 through 13 are a graphical representations of embodiments of RF signals in accordance with the present invention.

Referring to FIG. 10, there is shown a graphical representation of an embodiment of output signal 30 in accordance with the present invention. Output signal 30 is the summation of output signals 35, 34, 36, or:

$$\sin \omega t + 0.1\sin 0.9\omega t + 0.1\sin 1.1\omega t \qquad (1)$$

where output signals 34, 36 have been attenuated in amplitude by ninety percent (90%) with respect to output signal 35, and where output signals 34, 36 have each been shifted by ten percent (10%) in frequency to respective, opposing sides of the fundamental frequency of output signal 35. As may be seen, envelopes 120 are forming. In other words, beating is occurring, as seen by low frequency beating signal 121, and amplitude modulation is occurring as seen by differences in amplitudes 122. In this example, amplitude modulation index or degree of modulation from 1 volt (namely, the amplitude of output signal 35) is (0.1+0.1), and thus as signals have additive and destructive interference, owing to differences in frequencies, amplitude will be modulated, or vary, ±0.2 volts from one volt accordingly.

Figure 11:
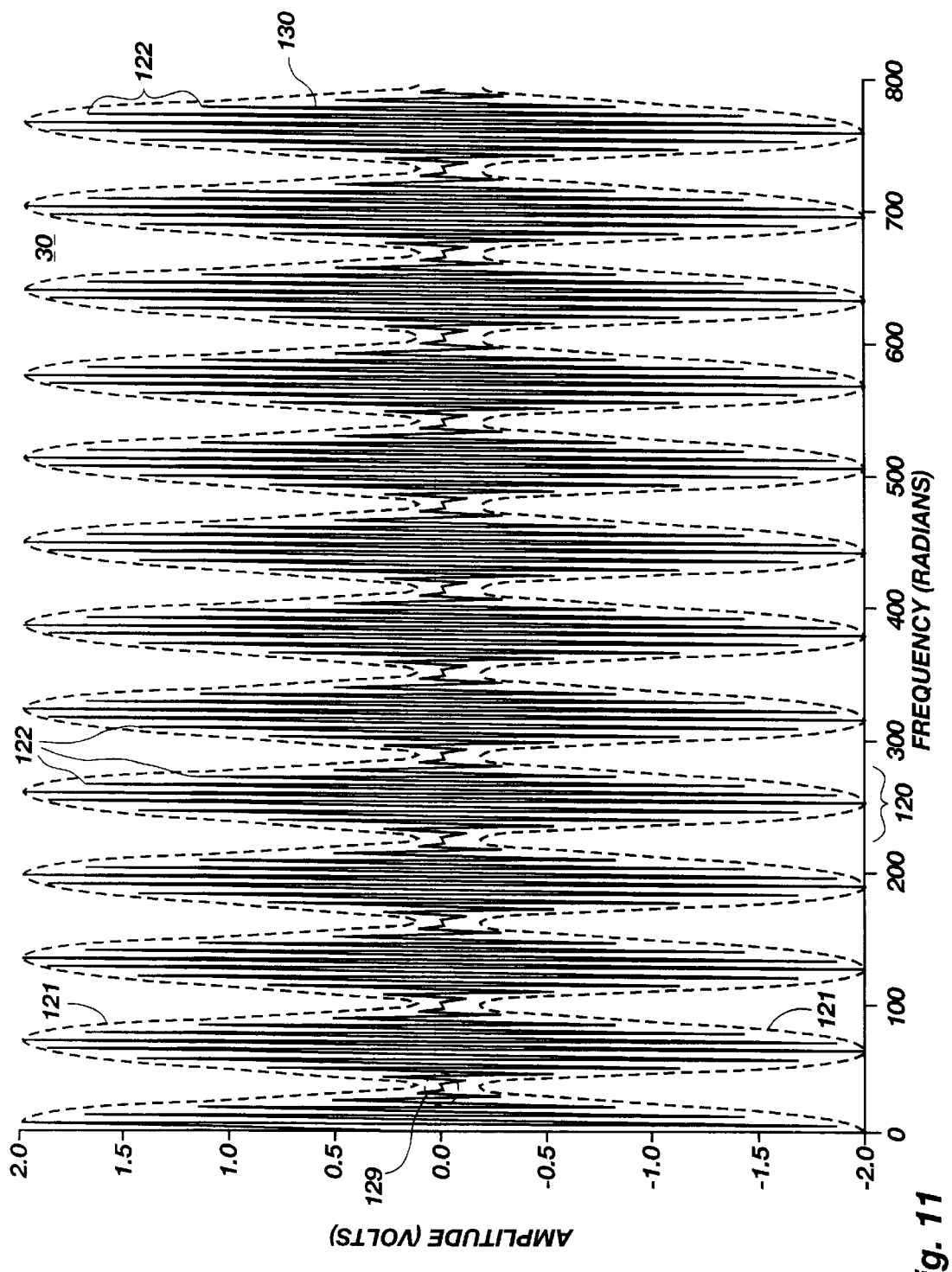

Referring to FIG. 11, there is shown a graphical representation of another embodiment of output signal 30 in accordance with the present invention. Output signal 30 is the summation of output signals 35, 34, 36, or:

$$\sin \omega t + 0.5\sin 0.9\omega t + 0.5\sin 1.1\omega t \qquad (2)$$

where output signals 34, 36 have been attenuated in amplitude by fifty percent (50%) with respect to output signal 35 and where output signals 34, 36 have each been shifted by ten percent (10%) in frequency to respective, opposing sides of the fundamental frequency of signal 35. As may be seen, envelopes 120 are more well-defined as compared with those of FIG. 10. This is due to an increase in modulation index, namely from 0.2 to 1. Thus, output signal 30 will be modulated within a range of ±1 volt from a one volt amplitude of output signal 35. Again, beating is occurring, as seen by low frequency beating signal 121, and amplitude modulation is occurring as seen by differences in and enveloping of amplitudes 122. This beating introduces an RF component of lower frequency than that of the constituent driving frequencies. In this embodiment, low frequency beating signal 121 is approximately one-tenth of the fundamental frequency, or approximately ten times fewer cycles per second than f. Also, as indicated by zero crossings 129 of output signal 30, a pulsed plasma may be provided in accordance with the present invention.

Figure 12:
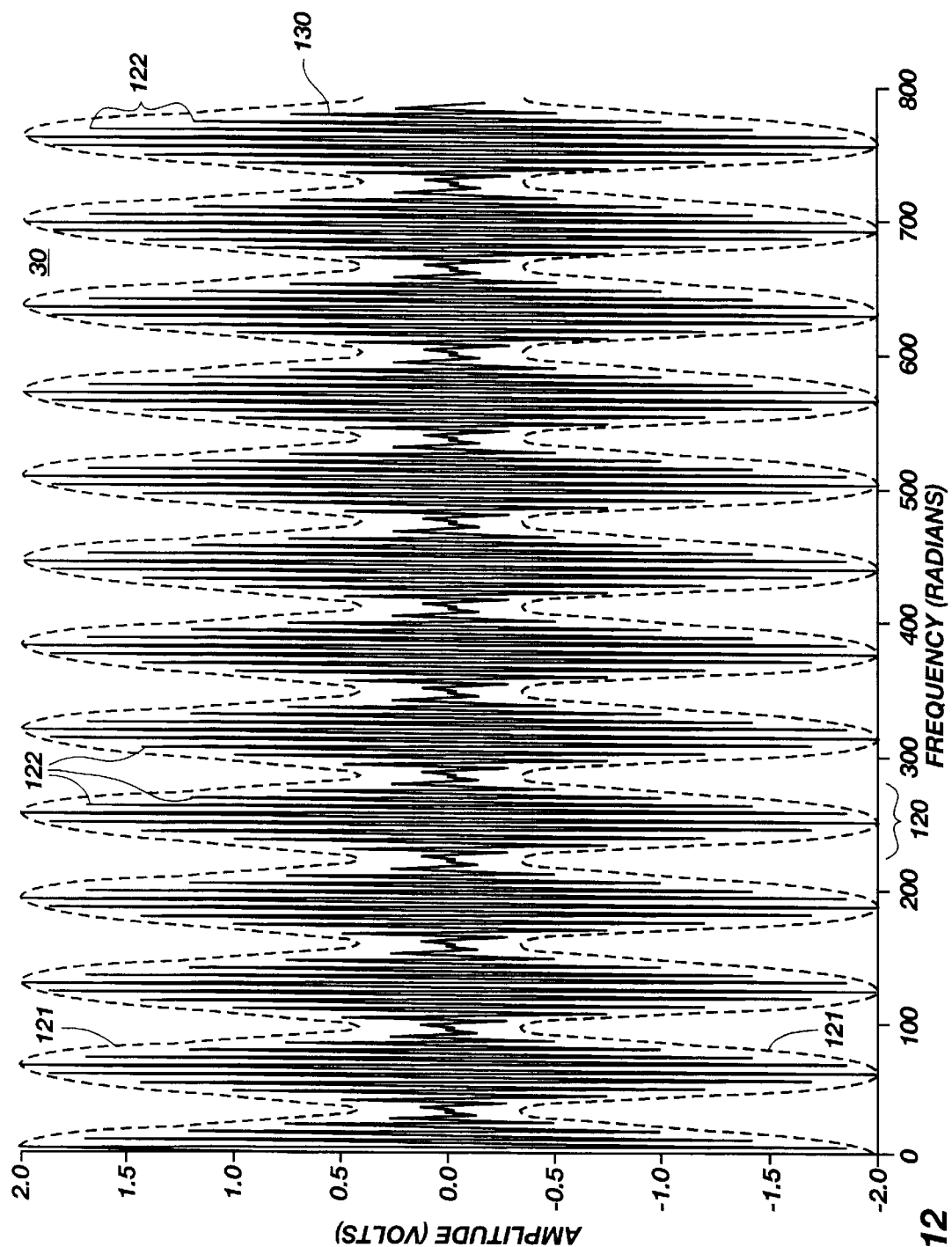

Referring to FIG. 12, there is shown a graphical representation of another embodiment of output signal 30 in accordance with the present invention. Output signal 30 is the summation of output signals 35, 34, 36, or:

$$\sin \omega t + 0.75\sin 0.9\omega t + 0.25\sin 1.1\omega t \qquad (3)$$

where output signal 34 has been attenuated in amplitude by twenty-five percent (25%) with respect to output signal 35, and where output signal 36 has been attenuated in amplitude by seventy-five percent (75%) with respect to output signal 35. As may be seen, envelopes 120 are slightly wider than those of FIG. 11. In other words, low frequency beating signal 121 of FIG. 12 is a lower frequency than that of FIG. 11.

Figure 13:
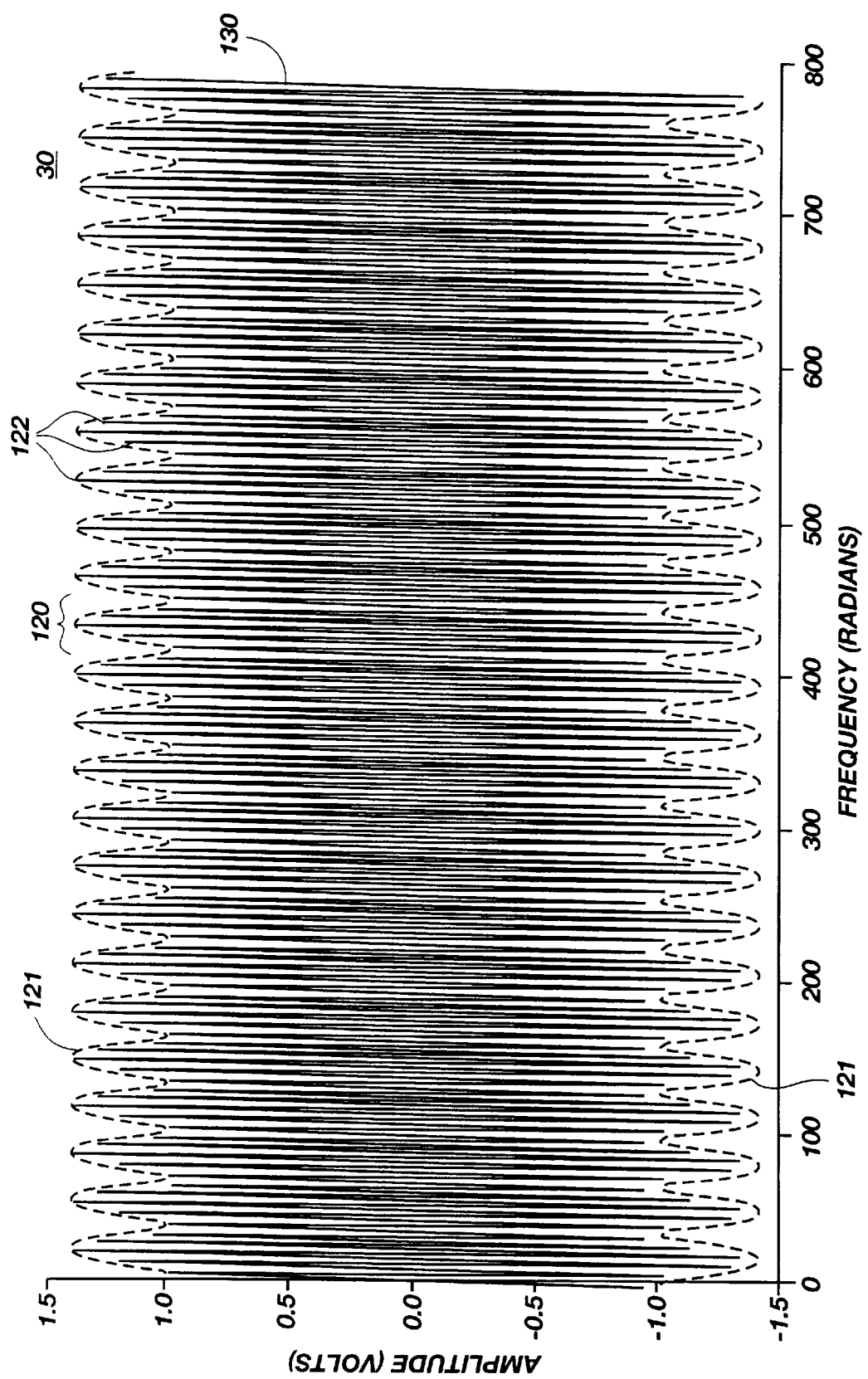
Figure 1:
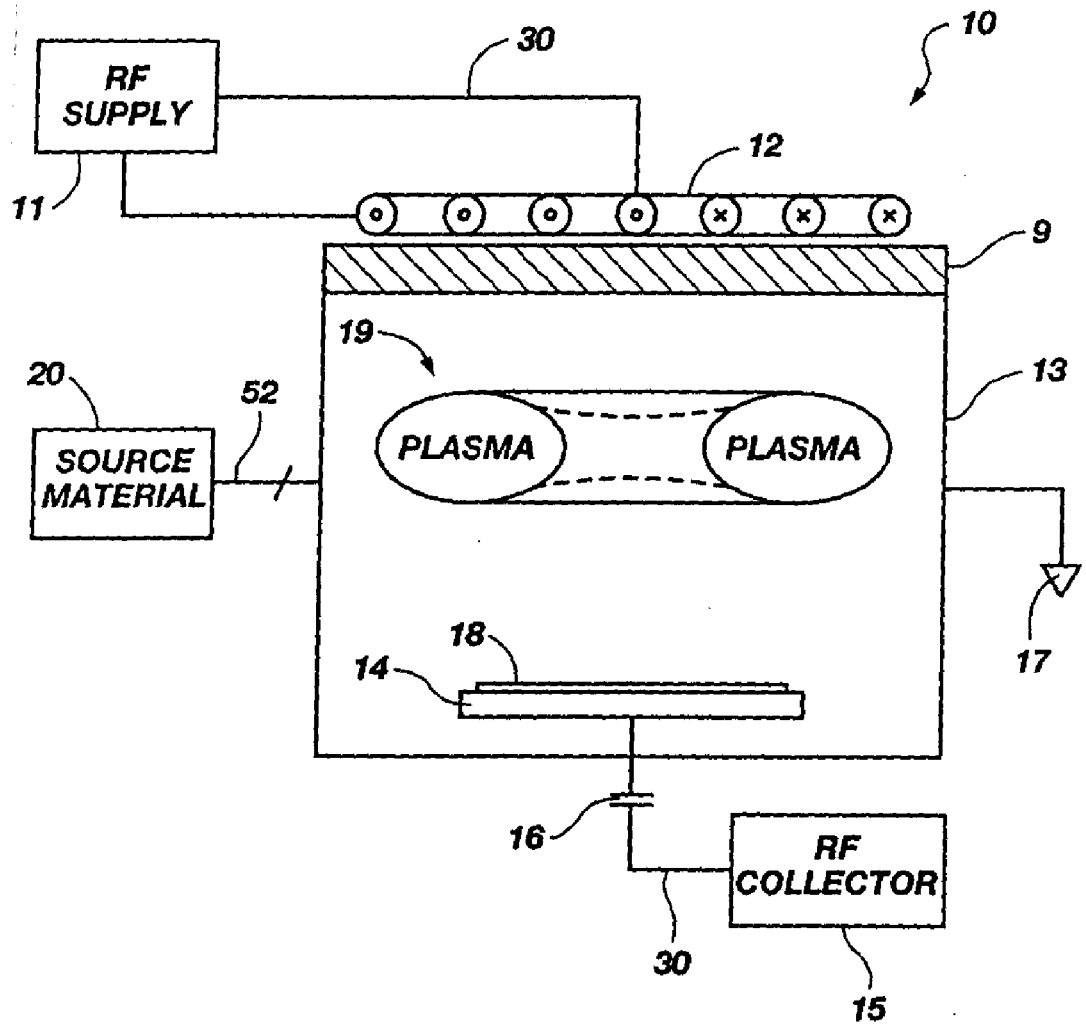

Referring to FIG. 13, there is shown a graphical representation of another embodiment of output signal 30 in accordance with the present invention. Output signal 30 is the summation of output signals 35, 34, 36, or:

$$\sin \omega t + 0.5\sin 0.9\omega t - 0.5\sin 1.1\omega t \qquad (4)$$

where output signals 34, 36 have each been attenuated in amplitude by fifty percent (50%) with respect to output signal 35, and where output signals 34, 36 have each been shifted by ten percent (10%) in frequency to respective, opposing sides of the fundamental frequency of output signal 35. However, in this embodiment, output signal 36 is subtracted from output signals 35, 34. As may be seen, envelopes 120 are less well-defined as compared with those of FIG. 11. However, beating is occurring as seen by low frequency beating signal 121. Amplitude modulation is occurring as seen by differences in amplitudes 122; however, amplitude modulation is not as exaggerated as that of FIG. 11.

Referring collectively to FIGS. 11 through 13, low frequency beating signal 121 facilitates modulating or pulsing a plasma in ECR and ICP systems in accordance with the present invention. ECR and ICP power sources are not efficient at low driving frequencies; however, the present invention provides high driving frequency signal 130 and obtains low frequency beating signal 121. As is seen in FIGS. 11 through 13, envelopes 120 represent low frequency pulsing for providing a modulated or pulsed plasma. In other words, modulated-bias plasmas 19, 24, 29, 104, 106, 113 may be pulsed with envelopes 120 in accordance with the present invention. Notably, the present invention facilitates amplitude modulation of high driving frequency signal 130 for providing an amplitude modulated plasma.

In diode systems, by applying powers of different frequencies to at least one RF electrode 102, 103, bias power is pulsed with low frequency beating signal 121 in accordance with the present invention. Low frequency beating signal 121 increases ion energy incident on wafer 18 (shown in FIGS. 4 and 5). A combination of low and high frequency power components affects gas chemistry in a plasma, as plasma is generated from electron impact reactions from electrons heated by different RF frequencies in accordance with the present invention. Thus, bias power now supplies energy for heating electrons, where low and high frequency effects are added simultaneously.

In triode systems, applying power of differing frequencies to at least one electrode 103, 108 or a different frequency to each electrode 103, 108 facilitates modulated plasma generation in accordance with the present invention.

The present invention has been particularly shown and described with respect to certain preferred embodiments and features thereof. In particular, etching and vapor deposition applications in accordance with the present invention have been described. However, it should be readily apparent to those of ordinary skill in the art that various changes and modifications in form and detail may be made without departing from the spirit and scope of the present invention as set forth in the appended claims.

What is claimed is:

1. A plasma reactor comprising:
   a multi-frequency radio frequency source in association with a plasma reactor chamber, the multi-frequency radio frequency source configured and operably coupled to provide signals of at least two different frequencies to form at least one beat frequency to a same electrode in the plasma reactor chamber.

2. A plasma reactor comprising:
   at least one multi-frequency radio frequency source configured to provide at least two signals of different frequencies to a plasma reactor chamber operably coupled to the at least one multi-frequency radio frequency source, the at least two signals of different frequencies adapted, in combination, to provide a beat frequency modulated signal to a same electrode in the plasma reactor chamber.

3. A plasma reactor comprising:

a multi-frequency radio frequency source configured to provide at least two signals of different frequencies to a same electrode in a plasma reactor chamber operably coupled to the multi-frequency radio frequency source, the at least two signals of different frequencies adapted, in combination to form a signal exhibiting at least one beat frequency.

4. An apparatus for plasma etching or chemical vapor deposition, the apparatus comprising:

a reactor chamber; and a multi-radio frequency (RF) source configured to provide at least two signals of different frequencies in electromagnetic communication with a same electrode in the reactor chamber to provide a signal exhibiting a beat frequency thereto.

5. An apparatus, as in claim 4, wherein the reactor chamber is associated with a reactor selected from a diode reactor and a triode reactor.

6. An apparatus, as in claim 4, wherein the reactor chamber is associated with a reactor selected from at least one of an inductively coupled plasma reactor, microwave reactor, and electron cyclotron resonance reactor.

7. A plasma reactor comprising:

a radio frequency (RF) collector having an output configured to provide an output signal comprising a combination of signals of different frequencies to provide at least one beat frequency; and a single electrode configured to receive the output signal.

8. A plasma reactor, as in claim 7, wherein the output signal comprises a bias voltage.

9. A plasma reactor, as in claim 8, wherein the plasma reactor is selected from the group consisting of an inductively coupled plasma system, a microwave system and an electron cyclotron resonance system.

10. A radio frequency (RF) source for a plasma reactor system having a chamber, the RF source comprising:

a plurality of RF generators configured to provide bias signals of differing frequencies; and a mixer configured to respond by combining the bias signals of differing frequencies into an output signal, the output signal comprising at least one beat frequency component and being operably coupled to a same electrode in the chamber of the plasma reactor system.

11. An RF source, as in claim 10, wherein the mixer is a summer.

12. An RF source, as in claim 10, wherein the bias signals are of differing power levels.

13. An RF source, as in claim 10, wherein the bias signals are of a same power level.

14. A radio frequency (RF) source for a plasma reactor system having a chamber, the RF source comprising:

an RF generator operably coupled to the chamber and configured to provide a plurality of different signal frequencies and to combine the different signal frequencies into an output signal exhibiting at least one beat frequency to a same electrode in the chamber.

15. A radio frequency (RF) source for a plasma reactor system having a reactor chamber, the RF source comprising:

an RF generator configured to provide at least two different signal frequencies; and the reactor chamber configured to receive and to mix the at least two different signal frequencies to provide at least one beat frequency signal to a same electrode to generate a pulsed plasma.

* * * * *

UNITED STATES PATENT AND TRADEMARK OFFICE
CERTIFICATE OF CORRECTION

PATENT NO. : 6,312,556 B1
DATED : November 6, 2001
INVENTOR(S) : Kevin G. Donohue and Marvin F. Hagedorn It is certified that error appears in the above-identified patent and that said Letters Patent is hereby corrected as shown below:

Drawings,
Please replace FIG. 1 with the attached FIG. 1.

Signed and Sealed this

Twenty-seventh Day of July, 2004

JON W. DUDAS
*Acting Director of the United States Patent and Trademark Office*